US012567845B2

(12) United States Patent
Lee et al.

(10) Patent No.: US 12,567,845 B2
(45) Date of Patent: Mar. 3, 2026

(54) AMPLIFIER AND ELECTRONIC SYSTEM INCLUDING THE SAME

(71) Applicant: Samsung Electronics Co., Ltd., Suwon-si (KR)

(72) Inventors: Jae Hoon Lee, Suwon-si (KR); Yong Lim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 627 days.

(21) Appl. No.: 17/979,148

(22) Filed: Nov. 2, 2022

(65) Prior Publication Data

US 2023/0223906 A1 Jul. 13, 2023

(30) Foreign Application Priority Data

Jan. 10, 2022 (KR) ........................ 10-2022-0003407
May 6, 2022 (KR) ........................ 10-2022-0055958

(51) Int. Cl.
*H03F 3/45* (2006.01)
*H03F 1/08* (2006.01)

(52) U.S. Cl.
CPC ......... *H03F 3/45269* (2013.01); *H03F 1/086* (2013.01); *H03F 2200/451* (2013.01)

(58) Field of Classification Search
CPC ................. H03F 3/45269; H03F 1/086; H03F 2200/451; H03F 2200/411; H03F 2203/45652; H03F 3/45237; H03F 3/45475; H03F 3/16; H03F 1/301; H03F 3/45183; H03F 3/45179; H03F 3/45192; H03F 3/45089; H03F 3/45; H04B 1/40

USPC .................................................. 330/253, 263
See application file for complete search history.

(56) References Cited

U.S. PATENT DOCUMENTS

| | | | | |
|---|---|---|---|---|
| 3,530,391 A | * | 9/1970 | Robert | H03F 3/45479 |
| | | | | 330/69 |
| 6,025,742 A | * | 2/2000 | Chan | H03K 19/018528 |
| | | | | 327/563 |
| 6,204,692 B1 | * | 3/2001 | Nakagawa | H04L 25/028 |
| | | | | 365/230.06 |
| 6,351,185 B1 | * | 2/2002 | Amrany | H03F 3/3022 |
| | | | | 330/261 |
| 6,380,797 B1 | * | 4/2002 | Macaluso | H04L 25/0272 |
| | | | | 327/83 |
| 6,486,820 B1 | | 11/2002 | Allworth et al. | |
| 6,894,543 B2 | * | 5/2005 | Ho | H04L 25/085 |
| | | | | 327/108 |
| 9,819,314 B1 | | 11/2017 | Chiu et al. | |

(Continued)

*Primary Examiner* — Khanh V Nguyen
(74) *Attorney, Agent, or Firm* — Fish & Richardson P.C.

(57) ABSTRACT

An amplifier and an electronic system including the same are provided. An amplifier includes a first NMOS transistor configured to receive a first input, a second NMOS transistor configured to receive a second input, the second NMOS transistor including a source connected to a source of the first NMOS transistor, a first resistor including a first end connected to a drain of the first NMOS transistor and a second end connected to a first output, a second resistor including a first end connected to a drain of the second NMOS transistor, and a second end connected to a second output, and the amplifier is configured to generate the first output and the second output based on the first input, the second input, a resistance value of the first resistor, and a resistance value of the second resistor.

20 Claims, 6 Drawing Sheets

(56)                    References Cited

U.S. PATENT DOCUMENTS

| | | |
|---|---|---|
| 10,454,435 B2 | 10/2019 | Liu |
| 10,476,443 B2 | 11/2019 | Fan |
| 10,594,264 B2 | 3/2020 | Hsieh et al. |
| 10,693,423 B2 | 6/2020 | Fan |
| 10,778,155 B2 | 9/2020 | White |
| 10,951,184 B2 | 3/2021 | Lee et al. |
| 2020/0395896 A1 | 12/2020 | Kim et al. |

* cited by examiner

DATA SIGNAL_a

DATA SIGNAL_b

Digital signal

Digital Signal

$V_{INP}$ $V_{INN}$

104a

104b $V_{OP2}$ $V_{ON2}$

104b

AMPLIFIER AND ELECTRONIC SYSTEM INCLUDING THE SAME

CROSS-REFERENCE TO RELATED APPLICATION

This application claims priority from Korean Patent Application No. 10-2022-0003407 filed on Jan. 10, 2022 in the Korean Intellectual Property Office, and from Korean Patent Application No. 10-2022-0055958 filed on May 6, 2022 in the Korean Intellectual Property Office and all the benefits accruing therefrom under 35 U.S.C. 119, the entire contents of each of which are incorporated herein by reference.

BACKGROUND

Various example embodiments of the inventive concepts relate to an amplifier, a method of operating the amplifier, and/or an electronic system including the amplifier.

A dynamic amplifier is widely used in electronic systems in various fields, for example, wireless communication systems, and/or memory systems, etc. The dynamic amplifier is an element which expands the dynamic range of the above-described electronic system.

For example, the dynamic amplifier has high linearity, operates with low power, and has high stability to avoid oscillation, in an electronic system which includes an analog digital converter (ADC) that desires and/or requires high resolution, such as a pipeline ADC, successive approximation (SAR) ADC, and/or delta sigma modulation (DSM) ADC.

SUMMARY

At least one example embodiment of the inventive concepts provides a dynamic amplifier with improved stability.

At least one example embodiment of the inventive concepts provides an electronic system including a dynamic amplifier with improved stability.

The example embodiments of the inventive concepts are not limited to the above-mentioned benefits. Other benefits and/or advantages according to one or more of the example embodiments of the inventive concepts that are not mentioned may be understood based on following descriptions, and may be more clearly understood based on example embodiments according to the inventive concepts. Further, it will be easily understood that the benefits and/or advantages according to the one or more example embodiments of the inventive concepts may be realized using means shown in the claims and combinations thereof.

According to at least one example embodiment of the inventive concepts, there is provided an amplifier comprising, a first NMOS transistor configured to receive a first input, a second NMOS transistor configured to receive a second input, the second NMOS transistor including a source connected to a source of the first NMOS transistor, a first resistor including a first end connected to a drain of the first NMOS transistor and a second end connected to a first output, a second resistor including a first end connected to a drain of the second NMOS transistor, and a second end connected to a second output, and the amplifier is configured to generate the first output and the second output based on the first input, the second input, a resistance value of the first resistor, and a resistance value of the second resistor.

According to at least one example embodiment of the inventive concepts, there is provided an amplifier comprising, a first sub-dynamic amplifier, a second sub-dynamic amplifier, the first sub-dynamic amplifier including, a first-a NMOS transistor configured to receive a first input, a second-a NMOS transistor configured to receive a second input, the second-a NMOS transistor including a source connected to a source of the first-a NMOS transistor, a first resistor including a first end connected to a drain of the first-a NMOS transistor and a second end connected to a first-a output, and a second resistor including a first end connected to a drain of the second-a NMOS transistor and a second end connected to a second-a output, the second sub-dynamic amplifier including, a first-b NMOS transistor configured to receive an output of a drain of the first-a NMOS transistor, the first-b NMOS transistor including a drain connected to a first-b output, a second-b NMOS transistor configured to receive an output of a drain of the second-a NMOS transistor, the second-b NMOS transistor including a source connected to a source of the first-b NMOS transistor, and the drain of the second-b NMOS transistor is connected to a second-b output, and the amplifier is configured to generate the first-b output and the second-b output based on the first input, the second input, a resistance value of the first resistor, and a resistance value of the second resistor.

According to at least one example embodiment of the inventive concepts, there is provided an electronic system comprising, at least one processor, a communication interface configured to communicate with the at least one processor, wherein the communication interface includes an amplifier comprising, a first NMOS transistor configured to receive a first input, a second NMOS transistor configured to receive a second input, the second NMOS transistor including a source of the second NMOS transistor connected to a source of the first NMOS transistor, a first resistor including a first end connected to a drain of the first NMOS transistor and a second end connected to a first output, a second resistor including a first end connected to a drain of the second NMOS transistor, and a second end connected to a second output, and the amplifier configured to generate the first output and the second output based on the first input, the second input, a resistance value of the first resistor, and a resistance value of the second resistor.

BRIEF DESCRIPTION OF DRAWINGS

The above and other aspects and features of the example embodiments of the inventive concepts will become more apparent by describing in detail various example embodiments thereof with reference to the attached drawings, in which:

FIG. 5 is a circuit diagram showing another example dynamic amplifier according to some example embodiments.

Figure 6:
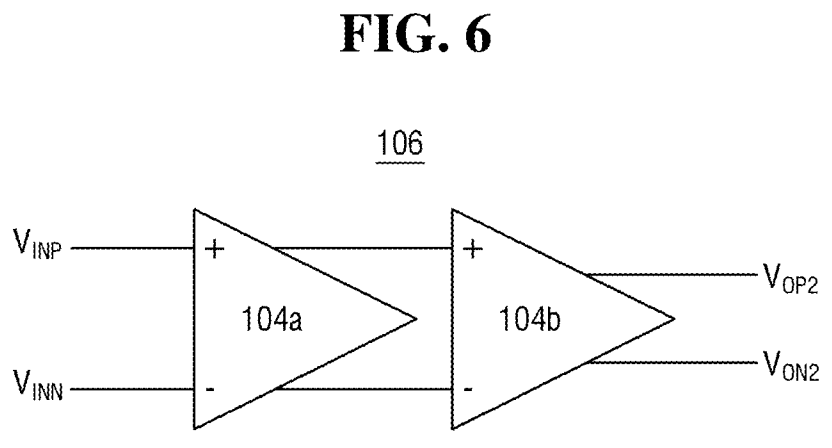

FIG. 6 is a simplified diagram showing another example dynamic amplifier in which a plurality of sub-dynamic amplifiers are connected to each other according to some example embodiments.

Figure 7:
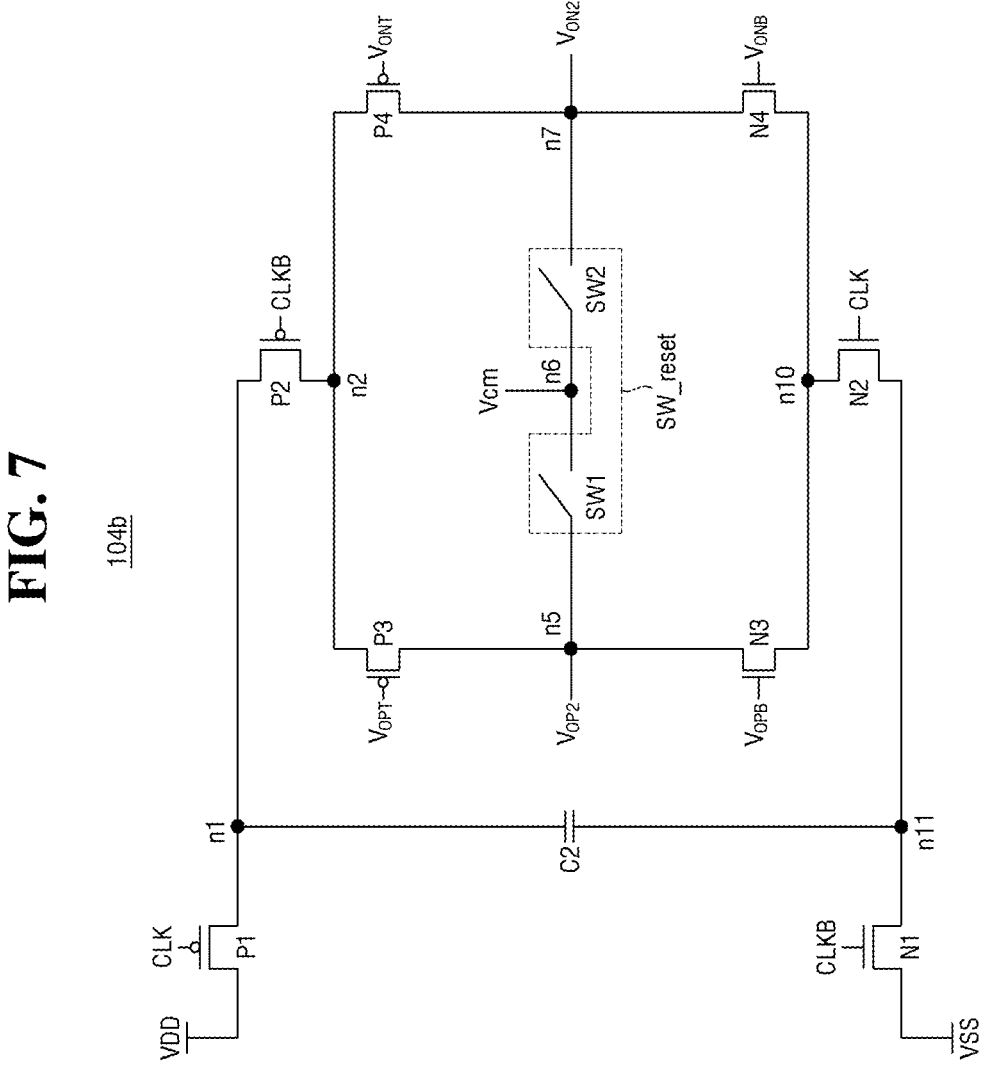

FIG. 7 is a block diagram showing an example of the sub-dynamic amplifier 104*b* of FIG. 6 according to some example embodiments.

DETAILED DESCRIPTION

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of some example embodiments of the inventive concepts, numerous specific details are set forth in order to provide a thorough understanding of the inventive concepts. However, it will be understood that the inventive concepts may be practiced without these specific details. In other instances, well-known methods, procedures, components, and circuits have not been described in detail so as not to unnecessarily obscure aspects of the inventive concepts. Examples of various example embodiments are illustrated and described further below. It will be understood that the description herein is not intended to limit the claims to the specific example embodiments described. On the contrary, it is intended to cover alternatives, modifications, and equivalents as may be included within the spirit and scope of the example embodiments of the inventive concepts as defined by the appended claims.

A shape, a size, a ratio, an angle, a number, etc. disclosed in the drawings for illustrating example embodiments of the inventive concepts are examples, and the example embodiments of the inventive concepts are not limited thereto. The same reference numerals refer to the same elements herein. Further, descriptions and details of well-known steps and elements are omitted for simplicity and clarity of the description.

The terminology used herein is for the purpose of describing particular example embodiments only and is not intended to limit the example embodiments of the inventive concepts. As used herein, the singular forms "a" and "an" are intended to include the plural forms as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the terms "or" and "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the example embodiments of the inventive concepts.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Unless otherwise defined, all terms including technical and scientific terms used herein have the same meaning as commonly understood by one of ordinary skill in the art to which the example embodiments of the inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain example embodiment may be implemented differently, a function or operation specified in a specific block may occur in a sequence different from that specified in a flowchart. For example, two consecutive blocks may be executed at the same time, etc. Depending on a related function or operation, the blocks may be executed in a reverse sequence and/or a modified sequence, etc.

In descriptions of temporal relationships, for example, temporal precedent relationships between two events such as "after", "subsequent to", "before", etc., another event may occur therebetween unless "directly after", "directly subsequent" or "directly before" is not indicated.

The features of the various example embodiments of the inventive concepts may be partially or entirely combined with each other, and may be technically associated with each other or operate with each other. The example embodiments may be implemented independently of each other and may be implemented together in an association relationship.

Hereinafter, an example in which a dynamic amplifier according to some example embodiments is included in an analog digital converter will be described. The dynamic amplifier according to some example embodiments as described in the inventive concepts is not limited to the example in which the dynamic amplifier is included in the analog digital converter. In another example, the dynamic amplifier according to some example embodiments may be included in other various electronic systems, for example, wireless communication systems and/or memory systems, etc.

Figure 1:
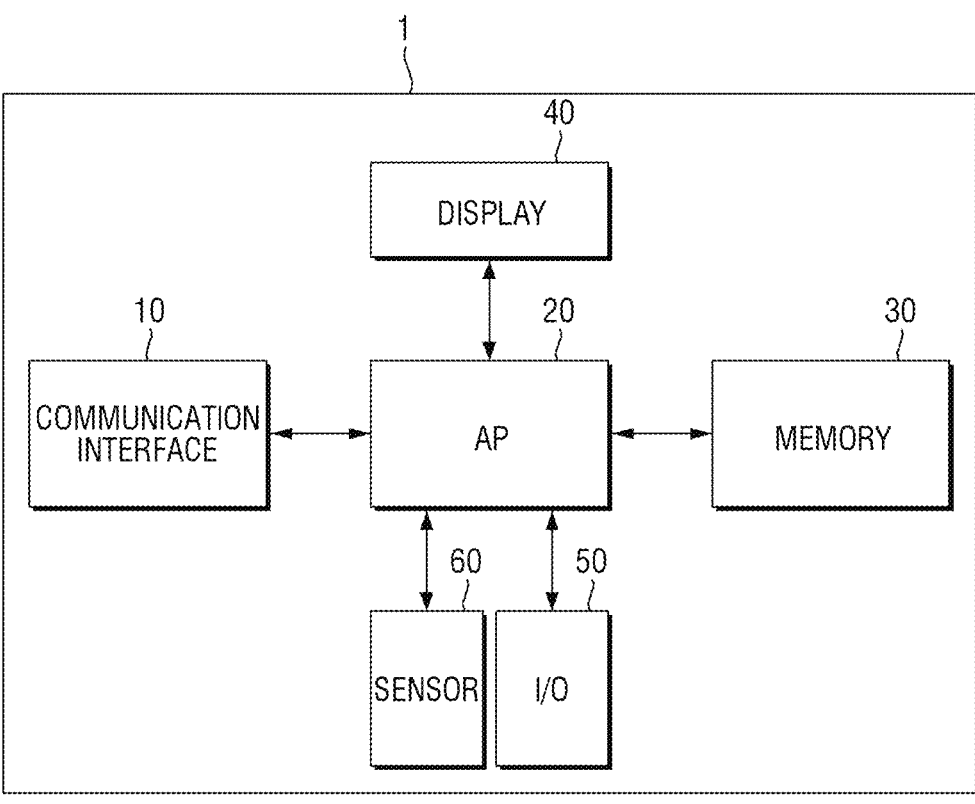
FIG. 1 is a block diagram illustrating an electronic system including a dynamic amplifier according to some example embodiments.
Figure 2A:
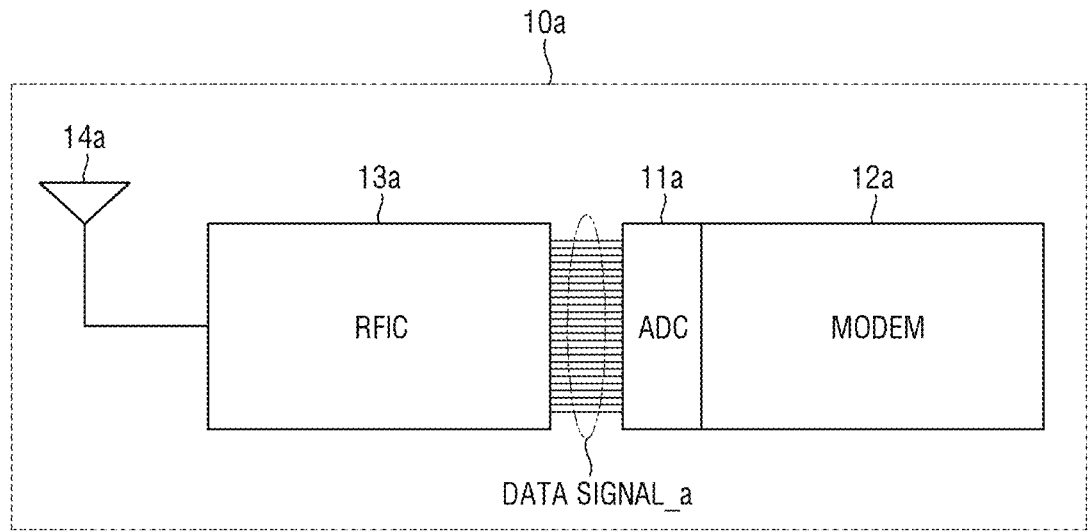
FIG. 2a to FIG. 2b are block diagrams illustrating example structures of a communication interface of the electronic system of FIG. 1 according to some example embodiments.
Figure 2B:
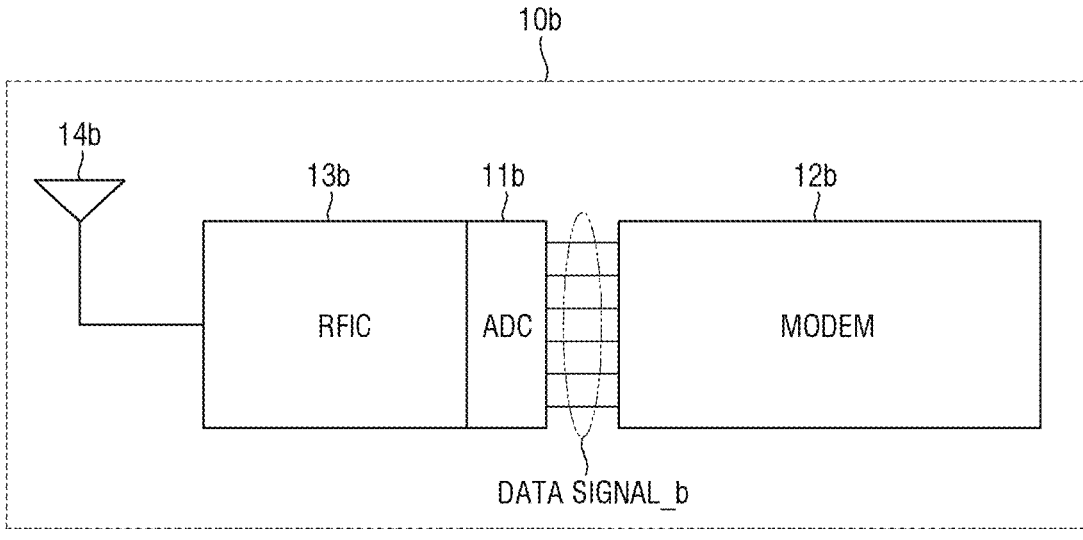

FIG. 1 is a block diagram illustrating an electronic system including a dynamic amplifier according to some example embodiments. FIG. 2*a* to FIG. 2*b* are block diagrams illustrating example structures of a communication interface of the electronic system of FIG. 1 according to some example embodiments.

An electronic system 1 according to some example embodiments may include a communication interface 10, at least one application processor (AP) 20, a memory 30 (e.g., a memory device, a memory subsystem, etc.), at least one display 40, at least one input/output (I/O) unit 50 (e.g., I/O device, etc.), and/or at least one sensor 60, etc., but the example embodiments are not limited thereto, and for example, the electronic system 1 may include a greater or lesser number of constituent components.

The communication interface 10 according to some example embodiments may be included in the electronic system 1. The electronic system 1 may have an accessible wired and/or wireless interface (e.g., a radio transceiver, etc.), and may include a device which may communicate with at least one other device through the wired and/or wireless interface and may transmit and/or receive data to and/or from the at least one other device. The accessible interface modem may include a modem communication interface that can be connected to a wired local area network (LAN), Wireless Local Area Network (WLAN) such as Wi-Fi, a Wireless Personal Area Network (WPAN) such as Bluetooth, wireless USB (Universal Serial Bus), Zigbee, Near Field Communication (NFC), Radio-frequency Identification (RFID), Power Line Communication (PLC), and/or mobile cellular networks such as 3G, 4G, LTE, 5G NR, etc., but the example embodiments are not limited thereto. The Bluetooth interface may support Bluetooth Low Energy (BLE), etc.

Specifically, the electronic system 1 may include the communication interface 10 for communicating with an external device. The communication interface 10 may be, for example, a modem communication interface which can be connected to a wireless short range communication interface such as a LAN, Bluetooth, Wi-Fi, a Zigbee, and/or a mobile communication network such as PLC, 3G, LTE, 5G NR, etc., but the example embodiments are not limited thereto.

The communication interface 10 may include a transmitter and/or a receiver, at least one communication processor (e.g., communication processing circuitry), etc. The electronic system 1 may transmit and/or receive information to and/or from an access point and/or a gateway through the transmitter and/or the receiver. Further, the electronic system 1 may communicate with a user device and/or another electronic system 1 and may transmit and/or receive control information and/or data of the electronic system 1 to and/or from the user device and/or another electronic system 1, etc.

Referring now to FIGS. 2a and 2b, according to some example embodiments, the communication interface 10 may include communication interfaces 10a and 10b. The communication interface 10a may include at least one antenna 14a (e.g., an antenna panel, an antenna array, etc.), radio-frequency integrated circuit (RFIC) 13a (e.g., the communication processor, the communication processing circuitry, etc.), an analog-digital converter (ADC) 11a and/or a modem 12a, but the example embodiments are not limited thereto. The RFIC 13a according to some example embodiments may receive a radio signal through the antenna 14a, and lower a frequency of the radio signal to a baseband, and then provide an analog data signal DATA signal_a to the analog-digital converter 11a, but is not limited thereto.

The analog-digital converter 11a converts the analog data signal DATA signal_a into a digital data signal. The modem 12a converts the digital data signal into a data signal that the AP 20 can process. According to at least one example embodiment, the analog-digital converter 11a and the modem 12a may be implemented into a single chip. The single chip including the analog-digital converter 11a and the modem 12a may be connected to the RFIC 13a via a plurality of analog signal lines, but is not limited thereto. Accordingly, the communication interface 10a according to some example embodiments may be a modem chip, etc. However, the example embodiments are not limited thereto, and for example, the RFIC 13a may be included in the chip including the ADC 11a and the modem 12a, etc.

The communication interface 10b may include at least one antenna 14b, RFIC 13b, an analog-digital converter 11b and/or a modem 12b, etc., but is not limited thereto. The RFIC 13b and the analog-digital converter 11b may be implemented into a single chip, but is not limited thereto. The single chip including the RFIC 13b and the analog-digital converter 11b may transmit a digital input signal DATA signal_b to the modem 12b. The modem 12b may convert the digital input signal DATA signal_b into a data signal that the AP 20 can process. The single chip including RFIC 13b and the analog-digital converter 11b may be connected to the modem 12b via a plurality of digital signal lines. Accordingly, a communication interface 10b according to some example embodiments may be an RF chip. However, the example embodiments are not limited thereto, and for example, the modem 12b may be included in the chip including the RFIC 13b and the ADC 11b, etc.

When the RFIC 13b and the analog-digital converter 11b are implemented into the single chip, the number of signal lines for transmitting the digital input signal DATA signal_b to the modem 12b is less than the number of signal lines for transmitting the analog input signal DATA signal_a to the modem 12a. However, the example embodiments of the inventive concepts are not limited thereto. The RFIC 13b, the analog-digital converter 11b, and the modem 12b may be implemented into a single chip, etc. Furthermore, the RFIC 13b, the analog-digital converter 11b, the modem 12b, and the AP 20 may be implemented into a single chip, etc.

According to some example embodiments, the communication interface 10 may include the analog-digital converters 11a and 11b. The analog-digital converters 11a and 11b may be implemented according to the following description, but are not limited thereto. Specifically, the receiver included in the communication interface 10 may include the analog-digital converters 11a and 11b. The electronic system 1 may transmit an internal state and/or data to an external device via the transmitter and/or may receive a control command and/or data from the external device via the receiver, etc.

The electronic system 1 may further include at least one processor and/or the AP 20 that performs computing, etc., but is not limited thereto. The electronic system 1 may further include a built-in battery for internal power supply and/or a power supply that receives external power, etc.

The memory 30 may store a control command code, control data, and/or user data for controlling and/or to be used by the electronic system 1. The memory 30 may include at least one of a volatile memory and/or a nonvolatile memory. The nonvolatile memory may include at least one of various memories, such as ROM (Read Only Memory), PROM (Programmable ROM), EPROM (Electrically Programmable ROM), EEPROM (Electrically Erasable and Programmable ROM), Flash Memory, PRAM (Phase-change RAM), MRAM (Magnetic RAM), ReRAM (Resistive RAM), FRAM (Ferroelectric RAM), etc. The volatile memory may include at least one of various memories, such as DRAM (Dynamic RAM), SRAM (Static RAM), SDRAM (Synchronous DRAM), etc.

Further, the electronic system 1 may include the display 40 (e.g., display panel, display device, etc.) for displaying an internal status and/or data thereon. A user may control the electronic system 1 via a user interface (UI) of the display 40 of the electronic system 1, etc.

The electronic system 1 may further include at least one storage device. The storage device may include a nonvolatile medium, such as a hard disk (HDD), a solid state disk (SSD), an eMMC (embedded Multi Media Card), and/or UFS (Universal Flash Storage), etc. The storage device may store therein user information provided via the input/output unit 50 and/or sensed information collected via the sensor 60, etc., but is not limited thereto.

Figure 3:
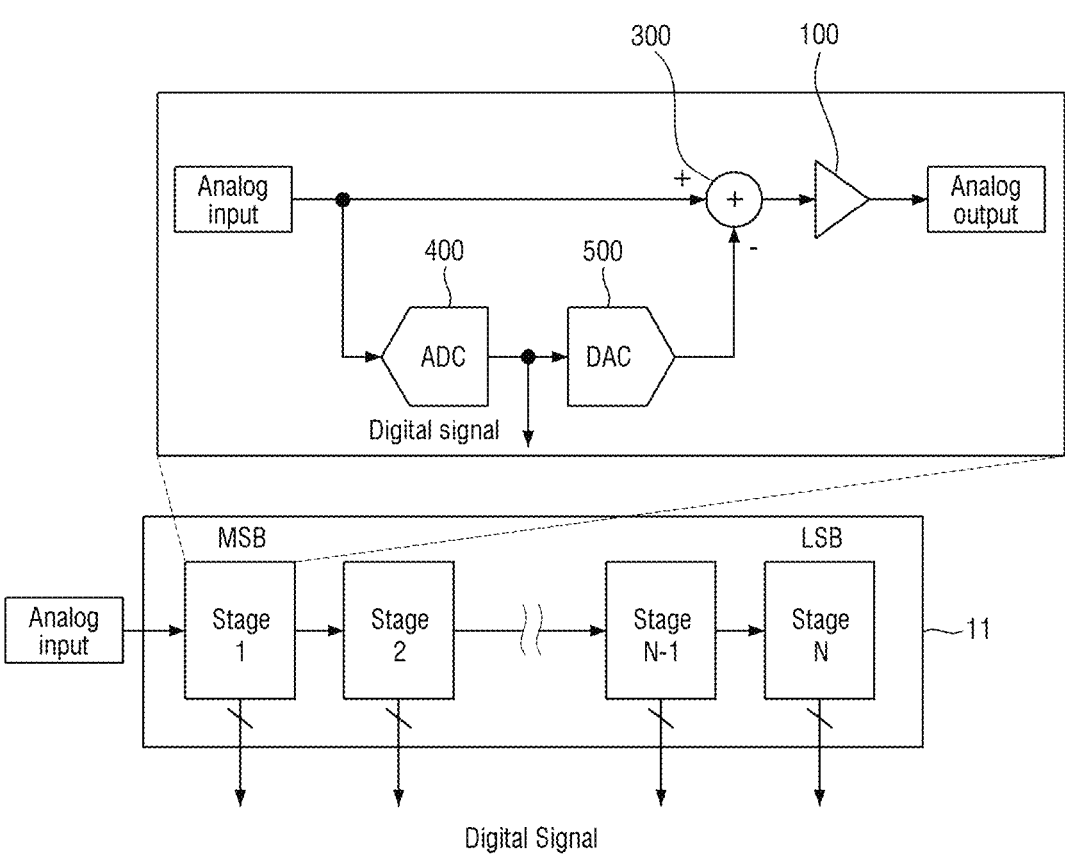
FIG. 3 is a block diagram illustrating an example analog digital converter included in the electronic system of FIG. 1 according to some example embodiments.

FIG. 3 is a block diagram illustrating an example analog digital converter included in the electronic system of FIG. 1 according to some example embodiments.

Referring to FIG. 3, the analog digital converter 11 may have a pipelined structure including a plurality of stages Stage 1 to Stage n, but is not limited thereto, and for example, the ADC 11 may have two or more parallel stages and/or pipelines, etc. The analog digital converter 11 may be a SAR ADC, a DSM ADC, or the like.

According to at least one example embodiment, the first stage Stage 1 may represent the most significant bit or byte (MSB), but is not limited thereto. According to at least one example embodiment, the n-th stage Stage n may represent the least significant bit or byte (LSB), but is not limited thereto.

The first stage Stage 1 may include a dynamic amplifier 100, an adder 300, an analog digital converter 400, and/or a digital analog converter 500, etc.

The dynamic amplifier 100 operates as a residual voltage amplifier according to at least one example embodiment. However, the example embodiments of the inventive concepts are not limited thereto. A gain value of the dynamic amplifier 100 may vary according to the number of digital output bits output from the analog digital converter 400. For example, when the analog digital converter 400 outputs 1.5 bits or 2 bits, an expected gain value may be 2, etc.

The dynamic amplifier 100 may receive an analog input signal and output an analog output signal. However, according to some example embodiments, the analog input signal may be a signal obtained by the adder 300 adding the analog input signal input to the first stage Stage 1 and a signal provided from the digital analog converter 500 to each other, but the example embodiments are not limited thereto.

The analog digital converter 400 may be embodied as a successive approximation register (SAR) analog digital converter, a flash analog digital converter, and/or a delta sigma analog digital converter, etc.

The analog digital converter 400 may output a digital signal corresponding to and/or based on an analog input. For example, 1.5 bits, 2 bits and 8 bits may be output therefrom, but the example embodiments are not limited thereto. The number of bits is only an example for describing the example embodiments of the inventive concepts, and the example embodiments of the inventive concepts are not limited thereto. Unlike the other stages, the first stage Stage 1 may output a MSB, but is not limited thereto. Additionally, the n-th stage Stage n may output a LSB, but is not limited thereto.

The digital analog converter 500 may perform digital-analog conversion on an analog input received from the analog digital converter 400 (e.g., the analog output signal output by the analog digital converter 400) in a corresponding manner. An inverter (not shown) may convert a sign of the digital output from the digital analog converter 500 before the digital output is input to the adder 300.

Hereinafter, the description of the first stage Stage 1 as made above may also apply each of the remaining stages Stage 2 to Stage n.

Figure 4:
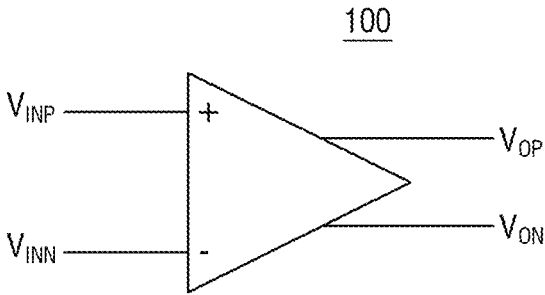
FIG. 4 is a simplified diagram illustrating an example dynamic amplifier according to some example embodiments.

FIG. 4 is a simplified diagram illustrating a dynamic amplifier according to some example embodiments.

Referring to FIG. 4, according to some example embodiments, the dynamic amplifier 100 receives a first input $V_{INP}$ and/or a second input $V_{INN}$, and generates a first output $V_{OP}$ and/or a second output $V_{ON}$, but is not limited thereto.

In the dynamic amplifier 100 according to some example embodiments, a difference between the first output $V_{OP}$ and the second output $V_{ON}$ may be a value obtained by amplification of a difference between the first input $V_{INP}$ and the second input $V_{INN}$ by an amplification gain of the dynamic amplifier 100. In other words, the difference between the first output $V_{OP}$ and the second output $V_{ON}$ is based on the difference between the first input $V_{INP}$ and the second input $V_{INN}$ and the amplification gain of the dynamic amplifier 100, etc., wherein the difference between the first input $V_{INP}$ and the second input $V_{INN}$ is amplified by the amplification gain amount of the dynamic amplifier 100, etc.

The dynamic amplifier 100 according to some example embodiments is illustratively described based on a circuit diagram thereof. Hereinafter, an example circuit diagram for illustrating the dynamic amplifier is provided. However, the circuit diagram of the dynamic amplifier according to some example embodiments is not limited thereto. For example, the dynamic amplifier 100 may have a greater or lesser number of inputs and/or outputs, etc.

Figure 5:
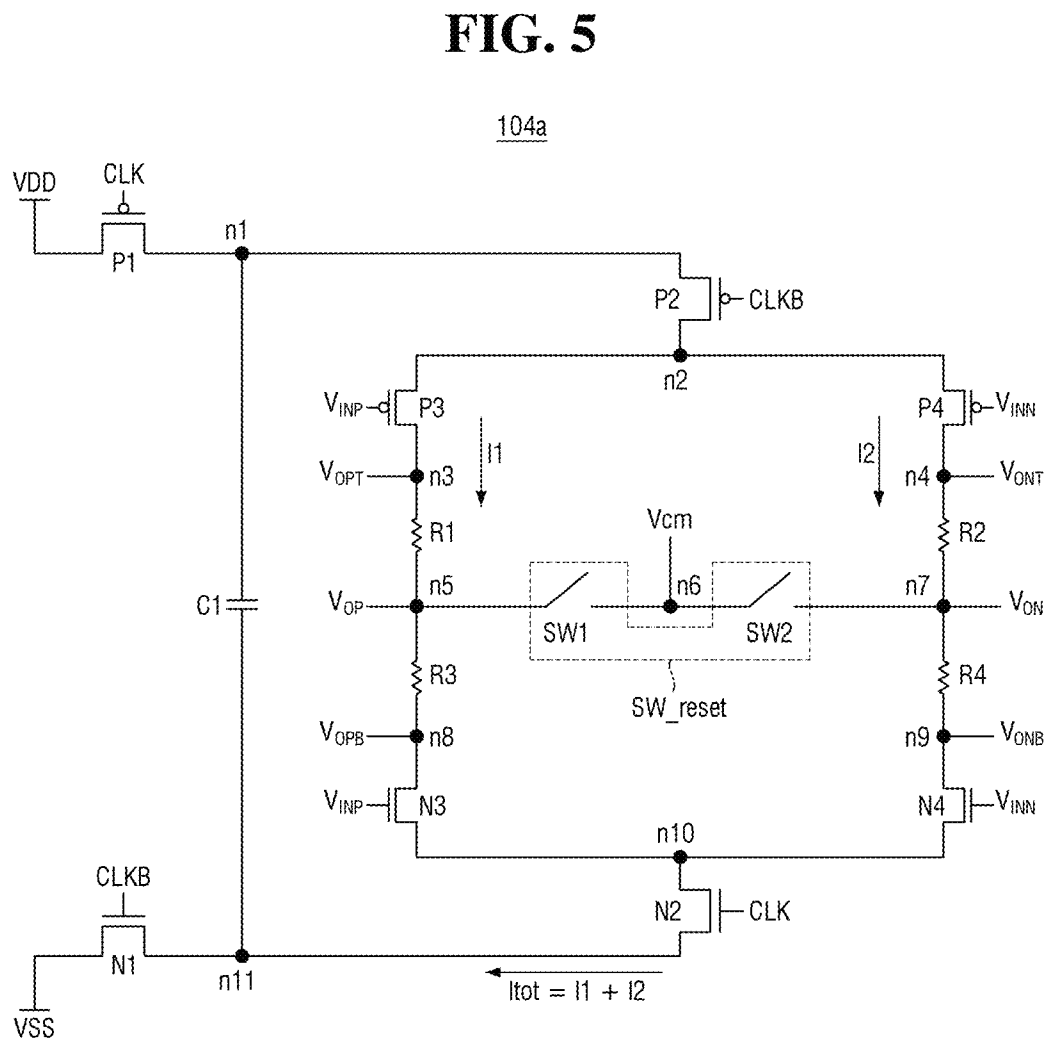

FIG. 5 is an example circuit diagram showing another dynamic amplifier according to some example embodiments.

Another dynamic amplifier 104*a* according to some example embodiments may be embodied as, for example, Floating Inverter Amplifier (FIA), but is not limited thereto.

In the dynamic amplifier 104*a*, at a first node n1, a first PMOS transistor P1 transmitting a power voltage VDD may be connected to a first capacitor C1, but the example embodiments are not limited thereto. Further, at an eleventh node n11, a first NMOS transistor N1 that transmits a ground voltage VSS may be connected to the first capacitor C1, but the example embodiments are not limited thereto.

The first PMOS transistor P1 may be gated based on a first clock signal CLK (or in other words, the gate of the first PMOS transistor P1 may receive a first clock signal CLK), and the first NMOS transistor N1 may be gated based on a second clock signal CLKB (or in other words, the gate of the first NMOS transistor N1 may receive a second clock signal CLKB). The second clock signal CLKB may be an inverted signal of the first clock signal CLK, but is not limited thereto.

When the first PMOS transistor P1 is turned on by the first clock signal CLK, the first capacitor C1 may accumulate charge from the and/or based on the power voltage VDD.

A second PMOS transistor P2 may be connected to the first PMOS transistor P1 at the first node n1. Further, a second NMOS transistor N2 may be connected to the first NMOS transistor N1 at the eleventh node n11.

The second PMOS transistor P2 may be gated based on the second clock signal CLKB (or in other words, the gate of the second PMOS transistor P2 may receive the second clock signal CLKB), and the second NMOS transistor N2 may be gated based on the first clock signal CLK (or in other words, the gate of the second NMOS transistor N2 may receive the first clock signal CLK).

A source of a third PMOS transistor P3, a source of a fourth PMOS transistor P4, and a drain of the second PMOS transistor P2 may be connected to each other at a second node n2. The third PMOS transistor P3 may be gated based on the first input $V_{INP}$ (or in other words, the gate of the third PMOS transistor P3 may receive the first input $V_{INP}$), and the fourth PMOS transistor P4 may be gated based on the second input $V_{INN}$ (or in other words, the gate of the fourth PMOS transistor P4 may receive the second input $V_{INN}$).

A source of the third NMOS transistor N3, a source of the fourth NMOS transistor N4, and a drain of the second NMOS transistor N2 may be connected to each other at a tenth node n10. The third NMOS transistor N3 may be gated based on the first input $V_{INP}$ (or in other words, the gate of the third NMOS transistor N3 may receive the first input $V_{INP}$), and the fourth NMOS transistor N4 may be gated based on the second input $V_{INN}$ (or in other words, the gate of the fourth NMOS transistor N4 may receive the second input $V_{INN}$).

The dynamic amplifier 104a according to some example embodiments may include a plurality of resistors, such as resistors R1, R2, R3, and/or R4, etc., to improve stability of the dynamic amplifier 104a, but the example embodiments are not limited thereto, and for example, a greater or lesser number of resistors may be used.

According to at least one example embodiment, a first resistor R1 is connected to a drain of the third PMOS transistor P3 at a third node n3. A first upper output $V_{OPT}$ may be generated via and/or at a third node n3. A second resistor R2 is connected to a drain of the fourth PMOS transistor P4 at a fourth node n4. A second upper output $V_{ONT}$ may be generated via and/or at the fourth node n4. A third resistor R3 is connected to a drain of the third NMOS transistor N3 at an eighth node n8. A first lower output $V_{OPB}$ may be generated via and/or at the eighth node n8. A fourth resistor R4 is connected to a drain of the fourth NMOS transistor N4 at a ninth node n9. A second lower output $V_{ONB}$ may be generated via and/or at the ninth node n9. However, the example embodiments are not limited thereto.

The dynamic amplifier 104a according to some example embodiments may increase and/or amplify the voltage of the first upper output $V_{OPT}$ of the third node n3 from the first output voltage $V_{OP}$ of the fifth node n5 by a value (e.g., gain voltage) obtained by multiplying a resistance of the first resistor R1 by a first current I1 flowing through the first resistor R1 and the third resistor R3. In other words, the first upper output voltage $V_{OPT}$ is generated based on the first output voltage $V_{OP}$ multiplied by the resistance of the first resistor R1 by the first current I1. Further, the dynamic amplifier 104a according to some example embodiments may decrease and/or reduce the voltage of the first lower output $V_{OPB}$ of the eighth node n8 from the first output voltage $V_{OP}$ of the fifth node n5 by a value obtained by multiplying a resistance of the third resistor R3 by the first current I1 flowing through the first resistor R1 and the third resistor R3. In other words, the voltage of the first lower output $V_{OPB}$ is generated based on the first output voltage $V_{OP}$ multiplied by the resistance of the third resistor R3 by the first current I1. Further, the dynamic amplifier 104a according to some example embodiments may increase (e.g., amplify) the second upper output $V_{ONT}$ of the fourth node n4 from the second output voltage $V_{ON}$ of the seventh node n7 by a value (e.g., gain voltage) obtained by multiplying a resistance of the second resistor R2 by a second current I2 flowing through the second resistor R2 and the fourth resistor R4. In other words, the second upper output $V_{ONT}$ is generated based on the second output voltage $V_{ON}$ multiplied by the resistance of the second resistor R2 by the second current I2. Further, the dynamic amplifier 104a according to some example embodiments may decrease the second lower output $V_{ONB}$ of the ninth node n9 from the second output voltage $V_{ON}$ of the seventh node n7 by a value obtained by multiplying a resistance of the fourth resistor R4 by the second current I2 flowing through the second resistor R2 and the fourth resistor R4. In other words, the voltage of the second lower output $V_{ONB}$ is generated based on the second output voltage $V_{ON}$ multiplied by the resistance of the fourth resistor R4 by the second current I2.

Accordingly, the dynamic amplifier 104a according to some example embodiments may improve the operational stability of the dynamic amplifier 104a using a plurality of resistors, e.g., the first resistor R1 to the fourth resistor R4, etc.

The third NMOS transistor N3 and the fourth NMOS transistor N4 may be identical to each other. However, the example embodiments of the inventive concepts are not limited thereto. The third PMOS transistor P3 and the fourth PMOS transistor P4 may be identical to each other. However, the example embodiments of the inventive concepts are not limited thereto.

According to some example embodiments, two or more of the plurality of resistors, e.g., first resistor R1 to the fourth resistor R4, etc., may have the same resistance value, but are not limited thereto. Alternatively, two or more of the plurality of resistors, e.g., first resistor R1 to the fourth resistor R4, etc., may have different resistance values. For example, the resistance values of the first resistor R1 and the second resistor R2 may have a first resistance value, while the third resistor R3 and the fourth resistor R4 may have a second resistance value different from the first resistance value, etc., but the example embodiments are not limited thereto.

The dynamic amplifier 104a according to some example embodiments includes a switch block SW_reset. The switch block SW_reset may be connected to and disposed between a fifth node n5 where the first output $V_{OP}$ is generated and a seventh node n7 where the second output $V_{ON}$ is generated, and thus may reset the first output $V_{OP}$ and the second output $V_{ON}$ to a common voltage Vcm, but is not limited thereto.

For example, the switch block SW_reset may include a plurality of switches, such as the two switches SW1 and SW2, etc., connected in series to each other, but the example embodiments are not limited thereto. In this regard, the common voltage Vcm may be applied to a sixth node n6 at which the first switch SW1 and the second switch SW2 are connected to each other.

FIG. 6 is a simplified diagram showing another dynamic amplifier in which a plurality of sub-dynamic amplifiers are connected to each other according to some example embodiments.

Referring to FIG. 6, in a dynamic amplifier 106 according to some example embodiments, the plurality of sub-dynamic amplifiers may be connected to each other. Although this figure illustrates that the dynamic amplifier 106 includes two sub-dynamic amplifiers, the example embodiments of the inventive concepts are not limited thereto. For example, N sub-dynamic amplifiers (N is a natural number equal to or larger 3) may be connected to each other.

The dynamic amplifier 106 according to some example embodiments may include a first sub-dynamic amplifier 104a that receives the first input $V_{INP}$ and the second input $V_{INN}$, and a second sub-dynamic amplifier 104b that receives the outputs of the first sub-dynamic amplifier 104a and generates a first-b output $V_{OP2}$ and a second-b output $V_{ON2}$.

According to some example embodiments, at least one sub-dynamic amplifier among the plurality of sub-dynamic amplifiers included in the dynamic amplifier 106 may include the plurality of resistors, e.g., the first resistor R1 to the fourth resistor R4, etc., as described with reference to FIG. 5, thereby increasing output impedance of the dynamic amplifier 106, but the example embodiments are not limited thereto.

Hereinafter, an example in which the first sub-dynamic amplifier 104$a$ is implemented as the dynamic amplifier 104$a$ of FIG. 5 will be described. That is, an example in which the first sub-dynamic amplifier 104$a$ of the plurality of sub-dynamic amplifiers 104$a$ and 104$b$ included in the dynamic amplifier 106 is embodied as the amplifier 104$a$ of FIG. 5 according to some example embodiments is described. However, the example embodiments of the inventive concepts are not limited thereto. The second sub-dynamic amplifier 104$b$ may be embodied as the amplifier 104$a$ of FIG. 5 according to some example embodiments, and/or both the first and second sub-dynamic amplifiers may be implemented as the amplifier 104$a$ of FIG. 5, etc.

FIG. 7 is a block diagram showing the sub-dynamic amplifier 104$b$ of FIG. 6 according to some example embodiments.

Since a configuration of the dynamic amplifier 104$b$ of FIG. 7 is similar to that of the dynamic amplifier 104$a$ of FIG. 5, duplicative and/or redundant description thereof is omitted. Rather, description of the overall operations of the dynamic amplifier 106 of FIG. 6 will be provided.

Referring to FIG. 5 to FIG. 7, the second sub-dynamic amplifier 104$b$ receives, as inputs, a first-a upper output $V_{OPT}$, a first-a lower output $V_{OPB}$, a second-a upper output $V_{ONT}$ and a second-a lower output $V_{ONB}$ of the first sub-dynamic amplifier 104$a$, but the example embodiments are not limited thereto.

Further, the second sub-dynamic amplifier 104$b$ amplifies the first-a upper output $V_{OPT}$, the first-a lower output $V_{OPB}$, the second-a upper output $V_{ONT}$ and the second-a lower output $V_{ONB}$ of the first sub-dynamic amplifier 104$a$ to generate a first-b output $V_{OP2}$ and a second-b output $V_{ON2}$, but the example embodiments are not limited thereto.

As shown in FIG. 7, according to at least one example embodiment, a third NMOS transistor N3 of the second sub-dynamic amplifier 104$b$ is gated based on the first-a lower output $V_{OPB}$ (or in other words, the gate of the third NMOS transistor N3 may receive the first-a lower output $V_{OPB}$). A fourth NMOS transistor N4 of the second sub-dynamic amplifier 104$b$ is gated based on the second-a lower output $V_{ONB}$ (or in other words, the gate of the fourth NMOS transistor N4 may receive the second-a lower output $V_{ONB}$). A third PMOS transistor P3 of the second sub-dynamic amplifier 104$b$ is gated based on the first-a upper output $V_{OPT}$ (or in other words, the gate of the third PMOS transistor P3 may receive the first-a upper output $V_{OPT}$). A fourth PMOS transistor P4 of the second sub-dynamic amplifier 104$b$ is gated based on the second-a upper output $V_{ONT}$ (or in other words, the gate of the fourth PMOS transistor P4 may receive the second-a upper output $V_{ONT}$).

The second sub-dynamic amplifier 104$b$ receives, as the inputs, the outputs $V_{OPB}$, $V_{OPT}$, $V_{ONB}$, and $V_{ONT}$ whose phase margins has already been secured and/or sufficiently secured from the first sub-dynamic amplifier 104$a$. Thus, stability of the second sub-dynamic amplifier 104$b$ may also be improved, and therefore the stability of the dynamic amplifier 106 may be improved.

A second capacitor C2 of the second sub-dynamic amplifier 104$b$ according to some example embodiments may have a different capacitance value than that of a first capacitor C1 of the first sub-dynamic amplifier 104$a$, or may have the same capacitance value as that of the first capacitor C1 of the first sub-dynamic amplifier 104$a$.

Although various example embodiments of the inventive concepts have been described above with reference to the accompanying drawings, it will be understood by those of ordinary skill in the art that the example embodiments of the inventive concepts are not limited thereto and may be implemented in many different forms without departing from the technical ideas and/or essential features thereof. Therefore, it should be understood that the example embodiments set forth herein are merely examples in all respects and not restrictive.

What is claimed is:

1. An amplifier comprising:
a first sub-dynamic amplifier; and
a second sub-dynamic amplifier;
the first sub-dynamic amplifier including:
    a first-a NMOS transistor configured to receive a first input;
    a second-a NMOS Transistor configured to receive a second input, the second-a NMOS transistor including a source connected to a source of the first-a NMOS transistor;
    a first resistor including a first end connected to a drain of the first-a NMOS transistor and a second end connected to a first-a output;
    a second resistor including a first end connected to a drain of the second-a NMOS Transistor, and a second end connected to a second-a output, and
the second sub-dynamic amplifier including:
    a first-b NMOS transistor configured to receive an output of a drain of the first-a NMOS transistor, the first-b NMOS transistor including a drain connected to a first-b output;
    a second-b NMOS transistor configured to receive an output of a drain of the second-a NMOS transistor, the second-b NMOS transistor including a source connected to a source of the first-b NMOS transistor, and the drain of the second-b NMOS transistor is connected to a second-b output, and
wherein the amplifier is configured to generate the first-b output and the second-b output based on the first input, the second input, a resistance value of the first resistor, and a resistance value of the second resistor,
wherein the first-a output and the second-a output are connected to a first reset switch block, and the first reset switch block is configured to reset the first-a output and the second-a output to a common voltage,
wherein the first-b output and the second-b output are connected to a second reset switch block, and the second reset switch block is configured to reset the first-b output and the second-b output to the common voltage.

2. The amplifier of claim 1, wherein the resistance values of the first resistor and the second resistor are equal to each other.

3. The amplifier of claim 1, wherein the resistance values of the first resistor and the second resistor are different from each other.

4. The amplifier of claim 1, wherein the amplifier further comprises: a third resistor connected to the first-a output;
a fourth resistor connected to the second-a output;
a first-a PMOS transistor connected in series with the third resistor, the first-a PMOS transistor configured to receive the first input; and
a second-a PMOS transistor connected in series with the fourth resistor, the second-a PMOS transistor including a source connected to a source of the first-a PMOS transistor, and the second-a PMOS transistor is configured to receive the second input.

5. The amplifier of claim 4, wherein the resistance values of the first resistor and the second resistor and resistance values of the third resistor and the fourth resistor are equal to each other.

6. The amplifier of claim 4, wherein the resistance values of the first resistor and the second resistor and resistance values of the third resistor and the fourth resistor are different from each other.

7. The amplifier of claim 4, wherein the resistance values of each of the first resistor and the second resistor is equal to a first resistance value; and resistance values of each of the third resistor and the fourth resistor is equal to a second resistance value different from the first resistance value.

8. The amplifier of claim 1, wherein the first sub-dynamic amplifier further includes:

a first-a PMOS transistor including a source configured to receive a power voltage, a second-a PMOS transistor including a source configured to receive the power voltage, and wherein the sources of the first-a PMOS transistor and the second-a PMOS transistor are connected to each other, and wherein the second sub-dynamic amplifier further includes:

a first-b PMOS transistor including a drain and a source, the drain connected to the first-b output, and the source configured to receive the power voltage, and a second-b PMOS transistor including a drain and a source, the drain connected to the second-b output, and the source configured to receive the power voltage, and wherein the sources of the first-b PMOS transistor and the second-b PMOS transistor are connected to each other.

9. An amplifier comprising:

a first sub-dynamic amplifier; and a second sub-dynamic amplifier;

the first sub-dynamic amplifier including:

a first-a NMOS transistor configured to receive a first input, a second-a NMOS transistor configured to receive a second input, the second-a NMOS transistor including a source connected to a source of the first-a NMOS transistor, a first resistor including a first end connected to a drain of the first-a NMOS transistor and a second end connected to a first-a output, and a second resistor including a first end connected to a drain of the second-a NMOS transistor and a second end connected to a second-a output;

the second sub-dynamic amplifier including:

a first-b NMOS transistor configured to receive an output of a drain of the first-a NMOS transistor, the first-b NMOS transistor including a drain connected to a first-b output;

a second-b NMOS transistor configured to receive an output of a drain of the second-a NMOS transistor, the second-b NMOS transistor including a source connected to a source of the first-b NMOS transistor, and the drain of the second-b NMOS transistor is connected to a second-b output; and wherein the first sub-dynamic amplifier further includes:

a first-a PMOS transistor including a source configured to receive a power voltage, and a second-a PMOS transistor including a source configured to receive the power voltage, wherein the sources of the first-a PMOS transistor and the second-a PMOS transistor are connected to each other, and wherein the amplifier is configured to generate the first-b output and the second-b output based on the first input, the second input, a resistance value of the first resistor, and a resistance value of the second resistor.

10. The amplifier of claim 9, wherein the resistance values of the first resistor and the second resistor are equal to each other.

11. The amplifier of claim 9, wherein the resistance values of the first resistor and the second resistor are different from each other.

12. The amplifier of claim 9, wherein the second sub-dynamic amplifier further includes:

a first-b PMOS transistor including a drain and a source, the drain connected to the first-b output, and the source configured to receive the power voltage, and a second-b PMOS transistor including a drain and a source, the drain connected to the second-b output, and the source configured to receive the power voltage, wherein the sources of the first-b PMOS transistor and the second-b PMOS transistor are connected to each other.

13. The amplifier of claim 9, wherein the first sub-dynamic amplifier further includes:

a third resistor connected to the first-a output; and a fourth resistor connected to the second-a output.

14. The amplifier of claim 13, wherein the resistance values of the first resistor and the second resistor, and resistance values of the third resistor and the fourth resistor are equal to each other.

15. The amplifier of claim 13, wherein the resistance values of the first resistor and the second resistor, and resistance values of the third resistor and the fourth resistor are different from each other.

16. The amplifier of claim 13, wherein the resistance values of each of the first resistor and the second resistor are equal to a first resistance value; and resistance values of each of the third resistor and the fourth resistor are equal to a second resistance value different from the first resistance value.

17. The amplifier of claim 13, wherein the first-a output and the second-a output are connected to a first reset switch block; the first reset switch block is configured to reset the first-a output and the second-a output to a common voltage;

the first-b output and the second-b output are connected to a second reset switch block; and the second reset switch block is configured to reset the first-b output and the second-b output to the common voltage.

18. An electronic system comprising:

at least one processor;

a communication interface configured to communicate with the at least one processor, the communication interface including the amplifier according to claim 9.

19. The electronic system of claim 18, wherein the first sub-dynamic amplifier further includes:

a third resistor connected to the first-a output; and a fourth resistor connected to the second-a output;

wherein the first-a PMOS transistor is connected in series with the third resistor; and wherein the second-a PMOS transistor is connected in series with the fourth resistor.

20. The electronic system of claim 18, wherein the second sub-dynamic amplifier further includes:

a first-b PMOS transistor including a drain and a source, the drain connected to the first-b output, and the source configured to receive the power voltage, and a second-b PMOS transistor including a drain and a source, the drain connected to the second-b output, and the source configured to receive the power voltage, and wherein the sources of the first-b PMOS transistor and the second-b PMOS transistor are connected to each other.

* * * * *